US000001249H

United States Statutory Invention Registration [19]

[11] Reg. Number: H1249

[43] Published: Nov. 2, 1993

Machonkin et al.

[54] COATING PROCESSES WITH A POLYCRYSTALLINE DIAMOND PASSIVATION LAYER

[76] Inventors: Mary A. Machonkin, 816 Ivy Ct., Webster, N.Y. 14450; Frank Jansen, 29 Rickland Dr., Randolph, N.J. 07869; Michael P. O'Horo, 11 Eaglesfield Way, Webster, N.Y. 14450

[21] Appl. No.: 724,248

[22] Filed: Jul. 1, 1991

[51] Int. Cl.[5] ..... H01L 21/302; H01L 21/463

[52] U.S. Cl. ..... 437/233; 437/225; 148/DIG. 125; 148/DIG. 122

[58] Field of Search ..... 437/225, 228, 233; 148/DIG. 122, DIG. 125

[56] References Cited

U.S. PATENT DOCUMENTS

| | | | |
|---|---|---|---|
| 4,681,653 | 7/1987 | Purdes et al. | 156/614 |
| 4,740,263 | 4/1988 | Imai et al. | 156/613 |
| 4,747,922 | 5/1988 | Sharp | 204/192.11 |
| 4,830,702 | 5/1989 | Singh et al. | 156/613 |
| 4,842,945 | 6/1989 | Ito et al. | 428/457 |
| 4,844,785 | 7/1989 | Kitabatake et al. | 204/192.11 |
| 4,847,639 | 7/1989 | Sugata et al. | 346/140 |
| 4,859,493 | 8/1989 | Lemelson et al. | 427/45.1 |
| 4,869,923 | 9/1989 | Yamazaki | 427/38 |
| 4,919,974 | 4/1990 | McCune et al. | 427/249 |
| 4,990,939 | 2/1991 | Sakiya et al. | 346/140 PD |

FOREIGN PATENT DOCUMENTS 0258267 10/1990 Japan .

OTHER PUBLICATIONS

"Ion-Beam Deposition of Thin Films of Diamondlike Carbon", Saisenberg, R. Chabot, Journal of Applied Physics, vol. 42, 1971, pp. 2953 to 2958.

*Primary Examiner*—Donald P. Walsh
*Assistant Examiner*—Anthony R. Chi

[57] ABSTRACT

A process for minimizing or avoiding the corrosion of thermal ink jet heater components by the coating thereof with polycrystalline diamond.

14 Claims, 2 Drawing Sheets

A statutory invention registration is not a patent. It has the defensive attributes of a patent but does not have the enforceable attributes of a patent. No article or advertisement or the like may use the term patent, or any term suggestive of a patent, when referring to a statutory invention registration. For more specific information on the rights associated with a statutory invention registration see 35 U.S.C. 157.

COATING PROCESSES WITH A POLYCRYSTALLINE DIAMOND PASSIVATION LAYER

BACKGROUND OF THE INVENTION

This invention is generally directed to coating processes, and more specifically to the coating of various components in an imaging and printing apparatus. More specifically, the present invention is directed to the coating of heating elements in ink jet, and particularly thermal ink jet apparatus, which coatings can, for example, be abrasion, cavitation, and chemically resistant, electrically insulating, and function as a thermal conductor. In one embodiment of the present invention, the coating selected is comprised of diamond, or polycrystalline diamond. More specifically, the present invention in a specific embodiment relates to the coating of silicon heaters in thermal ink jet printing systems with polycrystalline diamond thereby enabling a passivation layer. Passivation refers in embodiments to protection against mechanical and chemical attack from external agents such as the inks selected. The polycrystalline diamond having a hardness comparable to single crystal diamond, the hardest known material, avoids or minimizes undesirable abrasion and cavitation caused by bubbles formed in the inks, thereby extending the lifetime of the components coated. The polycrystalline diamond, which is unaffected by either acids or bases as well as organic solvents, also avoids or minimizes undesirable chemical interactions between the inks and the heaters. Although no described to be limited by theory it is believed that since undoped polycrystalline diamond is an electrical insulator, it prevents the electrical current used to power the heaters from being transferred to the inks thus preventing electrolysis of the inks and undesirable reactions between the inks and heaters which are activated by the electric power.

In addition, diamond is an efficient conductor of heat from the heating elements or thermoelectrical transducers to the in the ink for a comparable thickness of tantalum or amorphous carbon needed to provide passivation, thus reducing the power requirements needed for the operation of the device. In *Handbook of Chemistry and Physics,* CRC Press, Boco Raton, Fla., R. C. Weast, Editor, 1983, page E-11, the thermal conductivity at 298.2 K is given for the following materials:

| | |
|---|---|
| Copper | 4.01 $Wcm^{-1}K^{-1}$ |
| Tantalum | 0.575 |
| Amorphous-Carbon | 0.0159 |
| Diamond, Type I | 9.90 |
| Diamond, Type IIa | 23.2 |
| Diamond, Type IIb | 13.6 |

Diamond of any type is considered superior to tantalum or amorphous-carbon, "diamond-like carbon", in terms of thermal conductivity. In a paper by A. Ono, T. Baba, H. Funamoto and A. Nishikawa, *Japanese Journal of Applied Physics,* 25 (1986) L808, there is indicated that the thermal conductivity of CVD polycrystalline diamond thin films is strongly depended on the amount of diamond character in the films and thus on the Raman peak at 1,330 $cm^{-1}$. The thermal conductivity drops by a factor of 100 when the films have a high amorphous content as shown by the increase in the Raman peak at 1,500 $cm^{-1}$ and a decrease in the peak at 1,330 $cm^{-1}$. Polycrystalline diamond thin films are shown to have a thermal conductivity close to that of single crystal diamond, Type IIb, which ia a factor of 2 higher than copper at 100° to 130° C., whereas amorphous carbon of "diamond-like carbon" has a thermally conductivity less than diamond and even less than copper.

Printing methods utilizing ink jet technologies as well known and ink jet printers are commercially available from, for example, Xerox Corporation as the ink jet printer 4020 TM. Also, there is illustrated, for example, in U.S. Pat. Nos. 4,335,369, 4,392,907 and 4,794,410, the disclosures of which are totally incorporated herein by reference, a particular ink jet printing technology which is based on thermal rather than electrostatic ink acceleration methods ink jet printing methods generally involve the physical separation of a predetermined and metered quantity of ink, which could be a dye based or a pigmented fluid material from an orifice. In these processes, ink jet heaters with, for example, coatings of silicon nitride and tantalum are selected. The silicon nitride layer is selected to provide electrical insulation between the heaters and the ink. The tantalum layer transfers the heat from the silicon heaters to the ink and acts as a compliant mechanical buffer to minimize cavitation damage. Since diamond is an electrical insulator, extremely hard and an excellent conductor of heat, a single layer of diamond can replace the two layers of silicon nitride and tantalum thereby decreasing the number of processing steps required to make the thermal ink jet device. When the tantalum layer is made to be 1 micron thick, it resists cavitation sufficiently well for the desirable operation of the device. However, since tantalum is not a particularly good conductor of heat, the power requirements for the heating elements become undesirably high. If the thickness of the tantalum layer is decreased to 0.5 micron, the power requirements for the heaters are reasonable, but in time the tantalum layer degrades due to cavitation damage from the bubbles in the inks. Diamond being both extremely hard and an excellent conductor of heat eliminates the above problems.

The aforementioned and other disadvantages are avoided with the processes of the present invention wherein polycrystalline diamond is selected.

Other thermal ink jet printing processes and apparatuses wherein the coatings of the present invention may be selected are illustrated in U.S. Pat. Nos. 4,639,748; 4,864,329 and U.S. Pat. Re. 32,572, the disclosures of each of the aforementioned patents being totally incorporated herein by reference.

In U.S. Pat. No. 4,925,701, the disclosure of which is totally incorporated herein by reference, there are illustrated processes for the preparation of polycrystalline diamond films, which films can be selected for the processes of the present invention in embodiments thereof. More specifically, this patent discloses a process for the preparation of continuous polycrystalline diamond films, which comprises applying to a substrate diamond powder in an amount of from about one particle per ten square microns to about 10 particles per square micron with an average particle diameter of from about 0.1 to about 0.4 micron, heating the resulting powdered substrate subsequent to incorporation in a processing apparatus; introducing a mixture of gases into the apparatus, which gases provide a supply of carbon and hydrogen; and decomposing the gas mixture.

In a patentability search report, the following United States patents are recited: U.S. Pat. No. 4,847,639, which discloses an ink jet recording head with liquid passages and electrothermal transducers for generating heat containing a heat generating resistance layer of an amorphous material containing halogen and hydrogen atoms in a matrix of carbon atoms; and U.S. Pat. Nos. 4,740,263; 4,830,702; 4,842,945; 4,844,785; 4,859,493; 4,869,923 and 4,919,974 all relating to diamond like thin films. The aforementioned search report mentions as collateral interest U.S. Pat. Nos. 4,681,653 and 4,747,922; and the *Journal of Applied Physics,* Volume 42, 1971, pp. 2953 to 2958, which relates to diamond like thin films.

Illustrated in copending patent application U.S. Ser. No. 624,031 the disclosure of which is totally incorporated herein by reference, is a selective seeding process of diamond films and wherein thermal ink jet heater protection pads are applied by this process. More specifically, there is disclosed in this application a method of forming a patterned, polycrystalline diamond film on a substrate, comprising applying to a substrate a photoresist layer; applying to said photoresist layer a diamond powder layer, said diamond power layer including diamond particles; exposing said photoresis layer and said diamond powder layer to electromagnetic radiation through a mask; developing said photoresis layer sufficiently to form a developed photoresis layer; heating the substrate, developer photoresis layer, and diamond powder layer in a processing apparatus, said heating step casing said developed photoresist layer to carbonize; introducing a mixture of gases into said apparatus, said mixture of gases including carbon-containing and hydrogen-containing gases; and decomposing said mixture of gases in said apparatus, whereby hydrogen in said hydrogen-containing gases remove said carbonized photoresist layer, and whereby carbon in said carbon-containing gases combines with said diamond particles forming diamond structures on said substrate.

Illustrated in U.S. Pat. No. 5,073,785, the disclosure of which is totally incorporated herein by reference, is a process for minimizing or avoiding drop deflection in ink jet devices which comprises coating the ink jet head components with amorphous carbon.

SUMMARY OF THE INVENTION

It is, therefore, a feature of the present invention to provide processes wherein polycrystalline diamond films can be selected as a hard coating for components in ink jet systems.

Another feature of the present invention resides in providing ink jet heaters with a chemically resistant coating of known polycrystalline diamond, which diamond in embodiments contains 1 weight percent of less of hydrogen.

Another feature of the present invention resides in providing ink jet heaters with a chemically resistant coating of known polycrystalline diamond, which diamond in embodiments has a peak in the Raman spectrum at 1,330 $cm^{-1}$.

Another feature of the present invention resides in providing ink jet heaters with a chemically resistant coating of polycrystalline diamond obtained by the process as illustrated in U.S. Pat. No. 4,925,701, the disclosure of which is totally incorporated herein by reference.

Further, a feature of the present invention is to provide polycrystalline diamond as a passivation layer for thermal ink jet heaters obtained by the process as illustrated in copending application U.S. Ser. No. 624,031, the disclosure of which is totally incorporated herein by reference.

Another feature of the present invention is to provide polycrystalline diamond as an electrically insulating layer on the thermal ink jet silicon heaters.

Another feature of the present invention is to provide polycrystalline diamond as an efficient thermal conducting layer for thermal ink jet silicon heaters Another feature of the present invention is to provide polycrystalline diamond as a single layer over the thermal ink jet silicon heaters in place of the two layers of silicon nitride and tantalum, thus for example reducing the number of processing steps in formulating such heaters.

Another feature of the present invention is to provide polycrystalline diamond as an abrasion resistant, cavitation resistant coating for thermal ink jet silicon heaters.

These and other features of the present invention can be accomplished by the provision of coated components. More specifically, the present invention is directed to processes for minimizing or avoiding the undesirable chemical corrosion of ink jet heaters from inks present in the thermal ink jet apparatus which comprises providing a coating or passivation layer of a polycrystalline diamond component. Furthermore, the present invention is directed to processes for minimizing or avoiding the undesirable mechanical damage or cavitation to the heaters caused by the bubbles in the inks. In one embodiment, the present invention comprises providing an ink jet heater with an abrasion resistant, cavitation resistant, chemical resistant, thermally conducting coating of polycrystalline diamond.

In a specific embodiment, the process of the present invention comprises the deposition of polycrystalline diamond films onto 3 inch diameter silicon wafers containing doped polysilicon thermal ink jet heater arrays. A 3 inch diameter wafer containing the thermal ink jet heater arrays can be seeded with submicron diamond particles by the process described in U.S. Pat. No. 4,925,701, the disclosure of which is totally incorporated herein by reference. This method has the advantage that nucleation and growth of the diamond film is achieved without abrasion of the silicon wafer and the micro-circuitry thereon. Other methods require the abrasion of the substrate in order for diamond to grow which would damage the delicate circuitry. After the wafer is seeded with submicron diamond particles, it is placed in a processing apparatus (FIG. 1) which is attached to a pump. The apparatus is evacuated to a few milliTorr pressure. A continuous diamond film, for example 0.2 to 10 microns thick (preferably 0.5 to 3 microns thick), was grown by hot filament assisted vapor deposition (CVD) under the following deposition conditions: 0.2 to 10 percent (by volume) methane or other carbon containing gas (preferably 1 to 3 percent methane); 0 to 2 percent (by volume) oxygen (preferably 0.3 to 0.5 percent); the balance being hydrogen; at a flow rate of 5 to 500 standard cubic centimeters per minute, sccm, (preferably 100 sccm); at a pressure of 10 to 100 Torr (preferably 35 Torr); and at a substrate temperature of 300° to 800° C. (preferably 400° to 600° C.). The seeded silicon wafer rests on a graphite substrate holder which has a thermocouple embedded in it in order to measure the temperature of the substrate (FIG. 1). The substrate holder containing the silicon wafer is under a parallel array of 4 inch long rhenium or tungsten straight wire filaments. The distance of the substrate holder from the filaments can be a few millimeters to 2 inches (preferably ¼ to ¾ inches). The diameter of the wire filaments can be 0.005, 0.010, or 0.020 inches. The wire filaments are attached, under tension, ⅛ to ½ inches apart, to electrodes so that the number of 4 inch long filaments covers an area which is 4 inches square above the substrate holder. This arrangement insures that a uniform diamond film will be deposited over the 3 inch diameter silicon wafer containing the thermal ink jet heater arrays. An AC low voltage, high current power supply is used to heat the filaments to 1,800° to 2,200° C. as determined by an optical pyrometer. The silicon wafer is heated by radiated heat from the filaments. The temperature of the silicon wafer can be changed by varying the filament temperature, distance from the filament, diameter of the filament, or by water cooling the substrate holder. This process is described in a publication by F. Jansen, M. A. Machonkin and D. Kuhman, *J. Vac. Sci. Technol.*, volume A8, issue number 5, page 3785 to page 3790, September/October 1990. The reactant gases are decomposed by the hot filaments, and carbon in the form of diamond condenses and grows on the submicron diamond seeds on the silicon water so that a 2 micron thick continuous polycrystalline diamond film is formed after 5 hours deposition time.

The thickness of the film in embodiments was shown to be 2 microns by examining a cross section of the film in a scanning electron microscope. The film was proven to be diamond by a peak at 1,332 $cm^{-1}$ in a Raman spectra. This peak is characteristic of diamond bonding. Little or no absorption at 1,550 $cm^{-1}$, characteristic of graphite or amorphous-carbon, was found. The film purity was determined by standard analytical techniques, including secondary ion mass spectroscopy, x-ray diffraction, and electron microprobe analysis. The element carbon was determined to be the predominant constituent of the film. Hydrogen was found to be present at a level of less than one weight percent.

As a test of the film hardness, a stainless steel stylus was scraped across the surface of the film. The film was then examined in a scanning electron microscope. There were no scratches on the diamond film. However, bits of stainless steel could be seen which had been removed from the stylus by the points of the diamond crystals in the film. Furthermore, scraping with a stainless steel stylus did not cause any of the diamond crystals to be pulled out of the film, nor did it cause adhesion failure of the film to the substrate.

To test for pinholes, 3:1 hydrofluoric acid/nitric acid was placed on the surface of the diamond. If pinholes were present, the acid would penetrate and attack the underlying silicon wafer causing visible spots. The film was found to be virtually pinhole free.

The electrical conductivity of the diamond film was measured and found to be $10^{-8}$(ohm cm)$^{-1}$. Therefore, the film is electrically insulating and can function as an insulating layer over the silicon thermal ink jet heaters. High quality diamond films such as these having a Raman peak at 1,330 $cm^{-1}$ have been shown to exhibit the high thermal conductivity which is characteristic of the single crystal form by D. T. Morelli, C. P. Beetz and T. A. Perry, *J. Appl. Phys.* 64, 3063(1988).

After the polycrystalline diamond film has been deposited over the silicon wafer, covering it entirely, the diamond film must be etched into the pattern required for a passivation layer over the silicon thermal ink jet heaters. Conventional reactive ion etching (RIE) with oxygen and an aluminum mask can be used for this purpose.

A layer of aluminum, 2 microns thick, is evaporated over the diamond film and etched to form the required pattern using conventional photolithography. The silicon wafer with the patterned aluminum over the diamond film can then be placed in a Plasma Therm reactor (FIG. 2) and etched with about 10 to about 100 sccm of oxygen (preferably 40 to 60 sccm) at a pressure of about 10 to about 500 mTorr, and preferably from about 50 to about 100 mTorr, and a rf power of from about 50 to about 600 watts, and preferably from about 50 to about 100 watts. The temperature of the silicon wafer during the etch is from about 30 to about 200° C., and preferably form about 30 to about 100° C. After 3 hours, the diamond film is etched into the same pattern as the aluminum mask. This was determined by examination in a scanning electron microscope. The aluminum mask is removed by etching in aluminum etchant. The silicon thermal ink jet heaters are now coated with a polycrystalline diamond passivation layer, and the wafer is now ready for metallization, finishing and packaging.

After the ink jet has been assembled and ink introduced, a heating pulse of 3 to 4 microseconds duration at a frequency of a 3 to 6 kHz is applied to the heating elements, causing the formation of bubbles in the ink and droplets to be ejected from the orifice. Thermal ink jets with diamond coated heating elements operate at lower voltage than those with silicon nitride/tantalum coatings providing comparable cavitation damage protection and thus require less power to operate. In addition, thermal ink jets with diamond coated heating elements have fewer failures due to cavitation damage and ink corrosion up to $10^9$ cycles of operation than those with silicon nitride/tantalum coated heaters, and so are more durable.

Generally, the coating is present in an effective thickness, including for example form about 0.2 to about 10 microns and preferably from about 0.5 to about 3 microns, however, other thicknesses can be selected.

DESCRIPTION OF FIGURES

There is illustrated in FIG. 1 an apparatus that may be selected for the present invention.

DETAILED DESCRIPTION OF THE INVENTION

Figure 1:
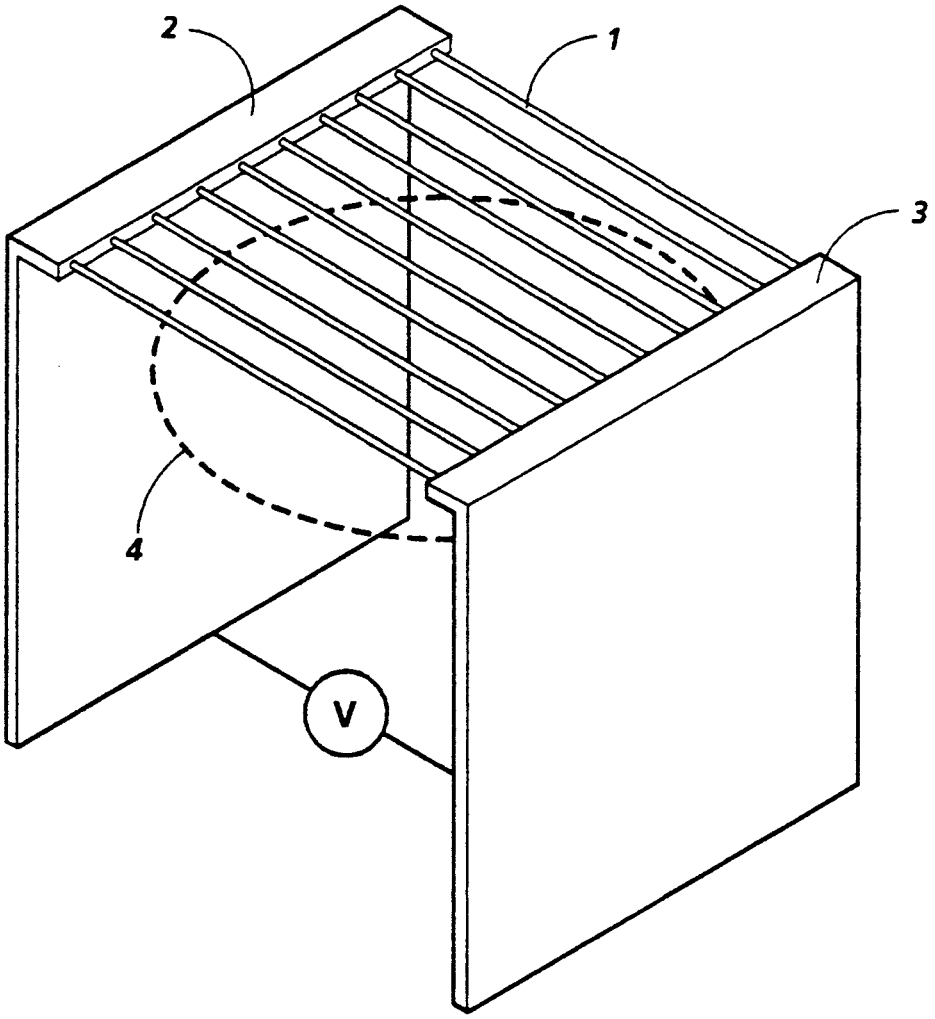

Examples of components that can be coated with polycrystalline diamond in effective thickness of, for example, from about 0.2 to about 10 microns, include ink jet heaters, which can be comprised of, for example, doped silicon, nickel-chrome alloys, cermet resistor materials and other known substances with a suitable ohmic resistivity.

The coating can be accomplished by a number of known methods including: microwave plasma-assisted CVD, reference M. Kamo, Y. Sato, S. Matumoto and N. Setaka, *J. Cry. Growth*, 62, 642 (1983); oxyactylene torch, reference M. Murakawa, S. Takeuchi and Y. Hirose, *Surface and Coatings Tech.* 39/40, 235 (1989); plasma jet CVD, reference K. Kurihara, K. Sasaki, M. Kawarada and N. Koshino, *Appl Phys. Lett.*, 52 437 (1988), and preferably is accomplished by the method known as hot filament deposition which is extensively described in a publication by F. Jansen, M. A. Machonkin and D. Kuhman, *J. Vac. Sci. Technol.*, volume A8, issue number 5, page 3785 to page 3790 , September-/October 1990, the disclosures of which are totally incorporated herein by reference. Generally, this method involves the decomposition of a carbon containing gas such as methane by passing over multiple wire filaments heated to 1,800° to 2,200° C. The carbon containing gas is present in a concentration of 0.2 to 10 percent (by volume) in hydrogen gas flowing at a rate of 5 to 500 sccm. Also present is an oxygen containing gas such as oxygen, carbon monoxide, or methanol at a concentration of 0 to 2 percent (by volume). The seeded silicon wafer containing the heater arrays rests on a graphite holder under the multiple filaments at a distance of a few millimeters to 2 inches. The silicon wafer is heated by the radiated heat from the filaments to a temperature of 300° to 800° C. All of the above are contained in a suitable processing apparatus, such as that of FIG. 1, which is attached to a pump. The pressure of the flowing gases in the processing apparatus is maintained at 10 to 100 Torr. Carbon in the form of diamond condenses and grows on the diamond seed particles on the substrate. The seed particles coalesce to form a continuous polycrystalline diamond film.

The etching of the polycrystalline diamond film into the required patterns can be accomplished by a variety of methods. One of these is a method developed by N. N. Efremow, M. W. Geis, D. C. Flanders, G. A. Lincoln and N. P. Economou, *J. Vac. Sci. Technol.* B3, 416 (1985), the disclosure of which is totally incorporated herein by reference. Preferably, instead of growing a continuous diamond film and then etching it into the required pattern, the diamond film could be seeded and grown in the required pattern from the beginning using one of the methods described in copending patent application U.S. Ser. No. 624,031, the disclosure of which is totally incorporated herein by reference.

As coatings, or passivation films there is selected for the processes of the present invention polycrystalline diamond. In one embodiment, the aforementioned diamond can be prepared by the process as illustrated in U.S. Pat. No. 4,925,701. The thickness of the film, which is, for example, from about 0.2 to about 10 microns, is measured by examining cross sections of the film in a scanning electron microscope.

As a test of the film hardness, a stainless steel stylus is traversed under mechanical load across the surface of the film. The film was then examined in a scanning electron microscope. There were no observable scratches on the diamond film but small pieces of stainless steel, which were abraded from the stylus, could be observed to adhere to the diamond surface along the trajectory of the stylus.

The thermal ink jet devices containing the diamond coating over the heating elements is run for up to $10^9$ cycles to test for durability of the device. Voltage needed for operation of heating elements is measured with a voltmeter.

Diamond coated heaters are chemically nonreactive to Lautrec inks which are water-based/ethylene glycol (20 to 40 percent) inks having a pH of 7. Also, the diamond coated heaters are resistant to inks having a high pH of 9 to 11 whereas tantalum is not.

Heaters are determined to have failed when no ink is ejected from the orifice caused by an interruption in electrical continuity or short-circuit. Devices are examined in an optical microscope and scanning electron microscope to ascertain the location and nature of the damage whether mechanical or corrosive, etc.

FIG. 1 illustrates a device and process that may be selected for the preparation of the coatings of the present invention in an embodiment thereof. This Figure illustrates multiple wire filaments 1 comprised of rhenium or tungsten, which are attached to electrodes 2 and 3 comprised of molybdenum, and the electrodes are connected to an electrical power source (not shown); the silicon wafer substrate containing the heater arrays to be coated is contained on a graphite substrate holder 4 having a thermocouple (not shown) for measuring temperature of substrate holder. All of the above are contained in a vacuum chamber (not shown) which has a gas inlet; a gas exhaust connected to a vacuum pump; and a quartz viewport for optical pyrometer (none of which are shown).

Figure 2:
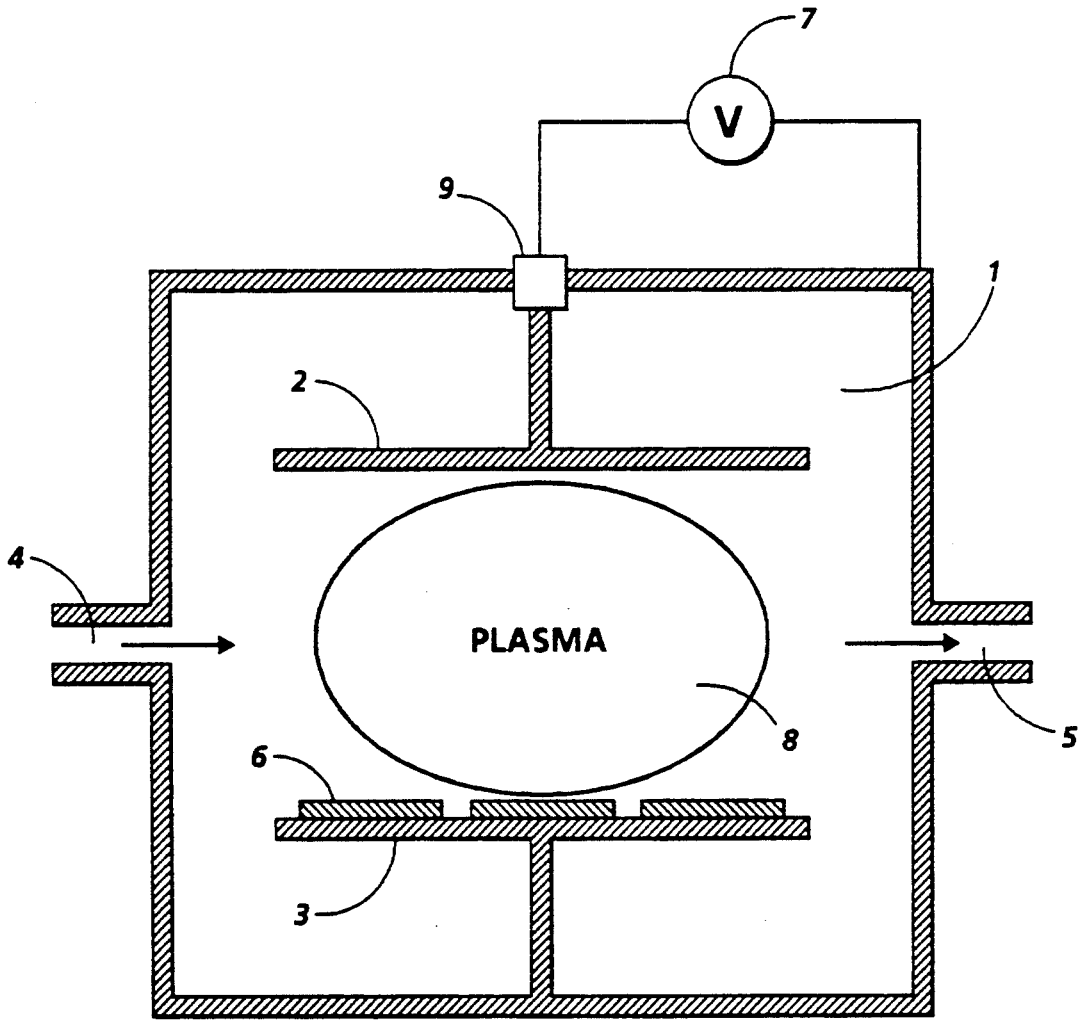
FIG. 2 illustrates a further apparatus that may be selected for the present invention.

FIG. 2 illustrates a device and process that may be selected for the etching of the coatings of the present invention into the required patterns for thermal ink jet heaters in an embodiment thereof. This Figure illustrates a vacuum chamber 1 with electrodes 2 and 3 comprised of a metal such as aluminum or stainless steel, which electrodes are usually water cooled, and wherein the vacuum chamber 1 is connected to a vacuum pump, not shown; a gas inlet means 4; a gas exhaust means 5; the silicon wafer substrate 6 coated with the polycrystalline diamond film and masked with aluminum is contained on electrode 3; electrical power source 7; a plasma 8; a voltage controller 9 wherein the electrical power is applied to the upper electrode and wherein the electrical chamber and lower electrode are grounded.

The structure of the silicon thermal ink jet heaters containing the silicon nitride and tantalum layers is described as follows: A silicon wafer substrate is comprised of multiple heater arrays which are made of phosphorous doped polycrystalline silicon, the ends of which are doped with higher levels of phosphorous. The center area or active heater area is covered by a thin layer of silicon nitride followed by a thicker tantalum layer. Aluminum electrodes are on the uncoated, higher phosphorous doped ends of the silicon heaters. A thick passivation layer of silicon dioxide covers the aluminum electrodes and the ends of the silicon nitride and tantalum layers.

The structure of the polycrystalline diamond coated thermal ink jet heaters is similar to that described above except that the silicon nitride and tantalum layers are replaced by a polycrystalline diamond layer.

The following Examples are being submitted to further define various species of the present invention. These Examples are intended to be illustrative only and are not intended to limit the scope of the present invention. Also, parts and percentages are by weight unless otherwise indicated.

EXAMPLE I

A 3 inch diameter wafer containing the thermal ink jet heater arrays is seeded with submicron diamond particles by a process in which 3 milligrams of 0.1 micron diamond powder is suspended in 3 milliliters of the alcohol methanol by means of ultrasonic vibrations at high energies using a microsonic disruptor. The suspension is applied to the silicon substrate containing the heater arrays. The substrate is spun at 3,000 rotations per minute in a conventional spin coater for 30 seconds resulting in a uniform distribution of diamond particles which are about 1 micron apart. The above process is described in U.S. Pat. No. 4,925,701, the disclosure of which is totally incorporated herein by reference, see Example I. After the wafer is seeded with submicron diamond particles, it is placed in the processing apparatus, FIG. 1, which is attached to a pump. The apparatus is evacuated to a few milliTorr pressure. A continuous diamond film of 2 microns thick is grown by hot filament assisted vapor deposition (CVD) under the following deposition conditions: 2.6 percent (by volume) of methane; 0.4 percent (by volume) of oxygen; 97 percent (by volume) of hydrogen; at a flow rate of 100 standard cubic centimeters per minute, sccm; at a pressure of 35 Torr; and at a substrate temperature of 500° C. The seeded silicon wafer rests on a graphite substrate holder which has a thermocouple embedded in it in order to measure the temperature of the substrate (FIG. 1). The substrate holder containing the silicon wafer is under a parallel array of 4 inch long rhenium straight wire filaments. The distance of the substrate holder from the filaments is ½ inch. The diameter of the wire filaments is 0.020 inch. Nine wire filaments are attached, under tension, ½ inch apart, to electrodes. An AC low voltage, high current power supply is used to heat the filaments to 2,000° C. as determined by an optical pyrometer. The silicon wafer was heated by radiated heat from the filaments. The reactant gases are decomposed by the hot filaments, and carbon in the form of diamond condensed and grew on the submicron diamond seeds on the silicon wafer so that a 2 micron thick continuous polycrystalline diamond film is formed after 5 hours deposition time. After the polycrystalline diamond film is deposited over the silicon wafer, covering it entirely, the diamond film is etched into the pattern required for a passivation layer over the silicon thermal ink jet heaters. Conventional reactive ion etching (RIE) with oxygen and an aluminum mask is used.

A layer of aluminum, 2 microns thick, is evaporated over the diamond film and etched to form the required pattern using conventional photolithography. The silicon wafer with the patterned aluminum over the diamond film is placed in a Plasma Therm reactor (FIG. 2) and etched with 60 sccm of oxygen at a pressure of 60 mTorr and a rf power of 100 watts. The temperature of the silicon wafer during the etch is about 30° C. After 3 hours the diamond film is etched into the same pattern as the aluminum mask. The aluminum mask is removed by etching in aluminum etchant. The silicon thermal ink jet heaters are now coated with a polycrystalline diamond passivation layer. The wafer is treated with standard processes for metallization, finishing and packaging. After the device is assembled, an ink composition comprised of water, 78 to 66 percent, ethylene glycol, 20 to 30 percent, and black BASF X-34 dye, 2 to 4 percent, is introduced therein, 30 to 45 volts are applied to the heater in 3 to 4 micron second pulses at a frequency of 2 to 6 kHz causing the formation of bubbles in the ink and droplets to be ejected form the orifice. The occurrence of a first heater failure doe to cavitation damage is increased by an order of magnitude into the $10^9$ pulse range by the use of diamond in place of the silicon nitride/tantalum layers.

EXAMPLE II

A 3 inch diameter wafer containing the thermal ink jet heater arrays is coated with a layer of photoresist followed by the application of a submicron diamond seed particle layer. The photoresist is exposed to ultraviolet radiation through a mask. The photoresist is then developed, thus patterning the photoresist layer and effectuating removal of diamond particles in unwanted areas so that the seed particles cover only the area of the heater to be coated with the diamond film. This process is described in copending patent application U.S. Ser. No. 624,031, the details of which are illustrated herein, see Example I. The wafer, seeded with submicron diamond particles, is placed in a processing apparatus, FIG. 1, which is attached to a pump. The apparatus is exvacuated to a few milliTorr pressure. A continuous diamond of 2 microns thick was grown by hot filament assisted vapor deposition (CVD) under the following deposition conditions: 2.6 percent (by volume) of methane; 0.4 percent (by volume) of oxygen; 97 percent (by volume) of hydrogen; at a flow rate of 100 standard cubic centimeters per minute, sccm; at a pressure of 35 Torr; and at a substrate temperature of 500° C. The seeded silicon wafer rests on a graphite substrate holder which has a thermocouple embedded in it in order to measure the temperature of the substrate (FIG. 1). The substrate holder containing the silicon wafer is under a parallel array of 4 inch long rhenium straight wire filaments. The distance of the substrate holder form the filaments in ½ inch. The diameter of the wire filaments is 0.020 inch. Nine wire filaments are attached, under tension, ½ inch apart, to electrodes. An ac low voltage, high current power supply is used to heat the filaments 2,000° C. as determined by an optical pyrometer. The silicon wafer is heated by radiated heat from the filaments. The reactant gases are decomposed by the hot filaments and carbon in the form of diamond condensed, and grew on the submicron diamond seeds on the silicon wafer so that a 2 micron thick continuous polycrystalline diamond film is formed after 5 hours deposition time. Since the diamond film covers only the heater area, no further etching of the diamond is required. The wafer is treated with standard processes for metallization, finishing and packaging. After the device is assembled and an ink comprised of water, 78 to 66 percent, ethylene glycol, 20 to 30 percent, and black BASF X-34 dye, 2 to 4 percent, is introduced, 30 to 45 volts are applied to the heater in 3 to 4 micron second pulses at a frequency of 2 to 6 kHz causing the formation of bubbles in the ink and droplets to be ejected from the orifice. The occurrence of a first heater failure due to cavitation damage is increased by an order of magnitude into the $10^9$ pulse range with the use of diamond in place of the silicon nitrode/tantalum layers.

Although the invention has been described with reference to specific preferred embodiments, it is not intended to be limited thereto; rather those skilled in the art will recognize variations, and modifications may be made therein which are within the spirit of the present invention and within the scope of the following claims.

What is claimed is:

1. A process for minimizing or avoiding the corrosion of thermal ink jet heater components consisting essentially of accomplishing the coating of said components with a polycrystalline diamond passivation layer, and wherein said polycrystalline diamond contains a peak at 1,330 $cm^{-1}$ in the Raman spectra.

2. A process in accordance with claim 1 wherein there is selected a plasma deposited thermally conducting polycrystalline diamond.

3. A process in accordance with claim 1 wherein the corrosion of ink jet heaters is avoided for extended time periods.

4. A process in accordance with claim 2 wherein the polycrystalline diamond layer is of a thickness of from about 0.2 to about 10 microns.

5. A process in accordance with claim 3 wherein the polycrystalline diamond layer is of a thickness of from about 0.2 to about 10 microns.

6. A process which comprises the growth of a continuous polycrystalline diamond film over a silicon wafer contained on thermal ink jet heaters by means of a hot filament assisted chemical vapor deposition which decomposes hydrogen and carbon containing gases in a processing apparatus; followed by etching the diamond film obtained in a pattern in a reactive ion etch processing apparatus using an aluminum mask and oxygen gas decomposed by a rf plasma, and wherein said diamond film contains a peak at 1,330 $cm^{-1}$ in the Raman spectra.

7. A process in accordance with claim 2 wherein the polycrystalline diamond contains from about 0.1 weight percent to about 1 weight percent of hydrogen.

8. A process in accordance with claim 3 wherein the polycrystalline diamond contains from about 0.1 weight percent to about 1 weight percent of hydrogen.

9. A process in accordance with claim 2 wherein the polycrystalline diamond selected possess an electrical conductivity of $10^{-8}$ $(ohm\text{-}cm)^{-1}$.

10. A process in accordance with claim 3 wherein the polycrystalline diamond selected possess an electrical conductivity of $10^{-8}$ $(ohm\text{-}cm)^{-1}$.

11. A process in accordance with claim 1 wherein the coating is of a thickness of from about 2,000 Angstroms to about 10 microns.

12. A process in accordance with claim 1 wherein the coating is of a thickness of from about 2,000 Angstroms to about 10 microns.

13. A process in accordance with claim 2 wherein the coating is of a thickness of from about 2,000 Angstroms to about 10 microns.

14. A process for minimizing the corrosion of thermal ink jet heaters consisting essentially of coating said ink jet heater with a thermally conducting polycrystalline diamond passivation layer, which layer is situated between the thermal ink jet heater and the ink jet composition selected for ink jet printing.

* * * * *